United States Patent
Li et al.

(10) Patent No.: US 9,496,146 B2
(45) Date of Patent: Nov. 15, 2016

(54) METHOD FOR FORMING THROUGH-BASE WAFER VIAS

(75) Inventors: Yuzhuo Li, Mannheim (DE); Changxue Wang, Potsdam, NY (US); Daniel Kwo-Hung Shen, Junghe (TW)

(73) Assignee: BASF SE, Ludwigshafen (DE)

(*) Notice: Subject to any disclaimer, the term of this patent is extended or adjusted under 35 U.S.C. 154(b) by 0 days.

(21) Appl. No.: 14/004,585

(22) PCT Filed: Feb. 28, 2012

(86) PCT No.: PCT/IB2012/050913
§ 371 (c)(1),
(2), (4) Date: Sep. 11, 2013

(87) PCT Pub. No.: WO2012/123839
PCT Pub. Date: Sep. 20, 2012

(65) Prior Publication Data
US 2013/0344696 A1    Dec. 26, 2013

Related U.S. Application Data

(60) Provisional application No. 61/451,622, filed on Mar. 11, 2011.

(51) Int. Cl.
| H01L 21/461 | (2006.01) |
| --- | --- |
| H01L 21/306 | (2006.01) |
| H01L 21/768 | (2006.01) |
| C09G 1/02 | (2006.01) |
| H01L 21/3105 | (2006.01) |
| H01L 21/321 | (2006.01) |

(52) U.S. Cl.
CPC ........... H01L 21/30625 (2013.01); C09G 1/02 (2013.01); H01L 21/76898 (2013.01); H01L 21/31053 (2013.01); H01L 21/3212 (2013.01)

(58) Field of Classification Search
CPC .................. H01L 21/76898; H01L 21/30625; H01L 21/3212; H01L 21/31053; C09G 1/02
USPC ..................................... 438/693, 692; 216/89
See application file for complete search history.

(56) References Cited

U.S. PATENT DOCUMENTS

| 5,057,560 | A  | 10/1991 | Mueller |
| 5,770,528 | A  | 6/1998 | Mumick et al. |
| 6,068,787 | A  | 5/2000 | Grumbine et al. |
| 6,682,642 | B2 | 1/2004 | Mikkola et al. |
| 6,936,543 | B2 | 8/2005 | Schroeder et al. |
| 6,974,777 | B2 | 12/2005 | Moeggenborg et al. |
| 7,250,391 | B2 | 7/2007 | Kanno et al. |
| 7,300,301 | B2 | 11/2007 | Lee |
| 7,300,601 | B2 | 11/2007 | Liu et al. |
| 7,361,603 | B2 | 4/2008 | Liu et al. |
| 7,678,696 | B2 | 3/2010 | Andry et al. |
| 7,683,459 | B2 | 3/2010 | Ma et al. |
| 7,754,098 | B2* | 7/2010 | Schroeder et al. .......... 252/79.1 |
| 2001/0054706 | A1 | 12/2001 | Levert et al. |
| 2002/0198328 | A1 | 12/2002 | L'Alloret |
| 2004/0209095 | A1 | 10/2004 | Manias et al. |
| 2004/0217009 | A1 | 11/2004 | Mikkola et al. |
| 2005/0014667 | A1 | 1/2005 | Aoyama et al. |
| 2005/0176259 | A1 | 8/2005 | Yokoi et al. |
| 2005/0266683 | A1 | 12/2005 | Lee |
| 2006/0124594 | A1 | 6/2006 | Lim et al. |
| 2006/0141254 | A1 | 6/2006 | Kramer et al. |
| 2006/0213780 | A1 | 9/2006 | Shih et al. |
| 2007/0029198 | A1 | 2/2007 | Kooi |
| 2007/0077865 | A1 | 4/2007 | Dysard et al. |
| 2007/0175104 | A1 | 8/2007 | Nishiyama et al. |
| 2007/0289875 | A1 | 12/2007 | Paneccasio, Jr. |
| 2008/0050435 | A1 | 2/2008 | Hennink et al. |
| 2008/0124913 | A1 | 5/2008 | Choi et al. |

(Continued)

FOREIGN PATENT DOCUMENTS

| CN | 101636465 A | 1/2010 |
| DE | 26 10 705 A1 | 9/1977 |
| EP | 0 583 814 A1 | 2/1994 |
| EP | 1 036 836 A1 | 9/2000 |
| EP | 1 306 415 A2 | 5/2003 |
| EP | 1 534 795 B1 | 7/2006 |
| EP | 1 197 587 B1 | 9/2006 |

(Continued)

OTHER PUBLICATIONS

Hans H. Gatzen et al. (Modeling CMP—Investigation of the Mechanical Removal Mechanism. Institute for Microtechnology, Hanover University, Garbsen, Germany, 2005 (4pages) Used Only As Evidence.*
Machine Translation of JP 2005203602 (2005) (13 pages).*
International Search Report and Written Opinion issued Jul. 12, 2012 in PCT/IB2012/050913.
Extended European Search Report issued Oct. 27, 2014 in Patent Application No. 12757663.5.

*Primary Examiner* — Binh X Tran
(74) *Attorney, Agent, or Firm* — Oblon, McClelland, Maier & Neustadt, L.L.P

(57) ABSTRACT

Method for manufacturing semiconductor wafers having at least one through-base wafer via, the said method comprising the steps of (1) providing a semiconductor wafer having at least one electrically conductive via comprising an electrically conductive metal and extending from the front side of the semiconductor wafer at least partially through the semiconductor wafer; (2) affixing the frontside of the semiconductor wafer to a carrier; (3) contacting the backside of the semiconductor wafer with a polishing pad and an aqueous chemical mechanical polishing composition having a pH of equal to or greater than 9 and comprising (A) abrasive particles; (B) an oxidizing agent containing at least one peroxide group; and (C) an additive acting both as metal chelating agent and metal corrosion inhibitor; (4) chemically mechanically polishing the backside of the semiconductor wafer until at least one electrically conductive via is exposed. Preferably, the additive (C) is 1,2,3-triazole.

20 Claims, No Drawings

(56) References Cited

U.S. PATENT DOCUMENTS

| | | |
|---|---|---|
| 2008/0249210 A1 | 10/2008 | Entenmann et al. |
| 2008/0254628 A1 | 10/2008 | Boggs et al. |
| 2008/0280452 A1 | 11/2008 | Yokoi et al. |
| 2009/0013609 A1 | 1/2009 | Gupta et al. |
| 2009/0215658 A1* | 8/2009 | Minsek et al. ............ 510/175 |
| 2009/0294916 A1 | 12/2009 | Ma et al. |
| 2010/0081279 A1 | 4/2010 | Palmer et al. |
| 2010/0097065 A1 | 4/2010 | Itskovich et al. |
| 2010/0200412 A1 | 8/2010 | Reid et al. |
| 2010/0225002 A1 | 9/2010 | Law et al. |
| 2010/0248479 A1* | 9/2010 | McDevitt ............ H01L 21/3212 438/693 |
| 2010/0267217 A1 | 10/2010 | Yang et al. |
| 2011/0300710 A1* | 12/2011 | Henry et al. .................. 438/693 |

FOREIGN PATENT DOCUMENTS

| | | | |
|---|---|---|---|
| EP | 1 942 179 A1 | 7/2008 | |
| JP | 2001-240850 A | 9/2001 | |
| JP | 2005203602 * | 7/2005 | ........... H01L 21/304 |
| WO | WO 01/60926 A1 | 8/2001 | |
| WO | WO 2004/029160 A1 | 4/2004 | |
| WO | WO 2004/052946 A1 | 6/2004 | |
| WO | WO 2004/063301 A1 | 7/2004 | |
| WO | WO 2005/014753 A1 | 2/2005 | |
| WO | WO 2006/093242 A1 | 9/2006 | |
| WO | WO 2007/012763 A1 | 2/2007 | |

* cited by examiner

METHOD FOR FORMING THROUGH-BASE WAFER VIAS

The present invention is directed to a novel method for forming through-base wafer vias, in particular, through-silicon vias (TSV).

CITED DOCUMENTS

The documents cited in the present application are incorporated by reference in their entirety.

BACKGROUND OF THE INVENTION

Three-dimensional (3D) integration of IC devices promises to reduce system form factor through direct stacking and interconnection of chips, made by using different technologies, into a single system. For this 3D integration, the semiconductor wafers carrying the chips and being arranged on top of each other have to be electrically connected. Such 3D architectures and methods for interconnecting the wafers are well-known in the art (cf. the American patent US 2010/0225002 A1 and the American patent U.S. Pat. No. 7,683,459 B2).

In order to build such 3D architectures, the stacked semiconductor wafers must contain interconnects or through-base wafer vias, in particular through-silicon vias (TSV), in the form of metal, in particular copper, nails. One of the enabling technologies to achieve such TSV is the formation of trenches in the semiconductor wafer substrates which reach deep into but not completely through the semiconductor wafer material. As the semiconductor wafers are typically 300 to 800 μm thick, the trenches have a depth of about 50 to about 600 μm. They can have different cross-sections such as squares, rectangles, triangles, circles, ellipses, etc. with diameters of about 1 to 200 μm. The trenches are then filled with an electrically conductive material (e.g., copper) by various well-known deposition methods (e.g., electroplating; cf. the American patent 2010/0200412 A1).

Thereafter, the semiconductor wafers having the filled trenches are thinned by removing the semiconductor wafer material (e.g., silicon in the case of silicon wafer processing) from the backside of the wafer. This can involve gluing the frontside of the semiconductor wafer, i.e., the side to which the filled trenches open, to a carrier wafer and chemically mechanically polishing (CMP) the backside of the semiconductor wafer until the bottoms of the filled trenches are exposed. By way of this thinning process, the electrically conductive through-base wafer vias are formed.

Chemical mechanical planarization or polishing (CMP) is the primary process to achieve local and global planarity of integrated circuit (IC) devices. The technique typically applies CMP compositions or slurries containing abrasives and other additives as an active chemistry between a rotating substrate surface and a polishing pad under an applied load. Thus, the CMP process couples a physical process such as abrasion with a chemical process such as oxidation or chelation. It is not desirable for the removal or polishing of substrate materials to be comprised of purely physical or purely chemical action, but rather the synergistic combination of both in order to achieve a fast uniform removal. This way, the substrate material is removed until the desired planarity is achieved.

In the case of the thinning process, a CMP slurry capable of polishing semiconductor wafer material (e.g., silicon in the case of a silicon wafer) at a sufficiently high rate is required so that a grinding step before the CMP becomes superfluous. Additionally, the CMP slurry must remove the electrically conductive material of the through-base wafer vias (e.g., copper) at the same rate or nearly the same rate as it removes the semiconductor material (e.g., silicon), in order to avoid deleterious defects. This means, that the ratio of the removal rate (MRR) of copper to the MRR of silicon, i.e., the copper over silicon selectivity, should be close to 1 or ideally 1.

Thus, when CMP slurries over-polish copper layers they may create a depression or "dishing" in the copper vias and trenches. This problem is made worse with through-silicon vias since these have often have large diameters, e.g., 100 μm diameter. This feature distortion is unacceptable to lithographic and other constraints in the IC manufacturing process. Another feature distortion which is disadvantageous for the IC manufacturing process is "erosion". Erosion is the topography difference between a field of dielectric and a dense array of copper vias or trenches. During CMP, the materials of the dense array may be removed or eroded at a faster rate than the surrounding field of dielectric which effect causes the topography difference.

Similar problems arise in the process of manufacturing through-based wafer vias, in particular TSV, when silicon oxide dielectric films such as silicon dioxide films prepared by low-pressure and high-pressure plasma chemical vapor deposition (LDP or HDP CVD) using monosilane-oxygen or tetraethylorthosilicate (TEOS)-oxygen plasmas are present. Such architectures are described, for example, in the American patent U.S. Pat. No. 7,678,696 B2. In this case, the MRRs should be high and the oxide over copper selectivity should be higher than 1.

The American patent application US 2010/0081279 A1 discloses a CMP slurry for the removal of copper and silicon in a process for manufacturing TSV. The CMP slurry comprises an oxidizing agent such as periodic acid, perchloric acid, a persulfate salt or acid thereof, a permanganate salt or acid thereof, ozone, silver oxide or elemental fluorine,
a metal chelating agent such as glycine,
abrasives,
water-miscible solvents,
surfactants,
pH-adjusting agents to adjust the pH between 5 to 13,
corrosion inhibitors such as 1,2,4-triazole, benzotriazole, 6-tolyltriazole, totyltriazole, 1-(2,3-dicarboxypropyl)benzotriazole and branched-alkyl-phenol-substituted benzotriazole,
fluorine containing compounds such as ammonium fluoride or tetramethylammonium fluoride,
non-polymeric nitrogen-containing compounds such as ammonium hydroxide or ethanolamine, and
biological agents such as bactericides, biocides and fungicides.

The CMP slurry can be tuned to exhibit high copper and silicon MRRs and selectivities of close to 1 or 1 at downforces of 7 psi (410 mbar). Astonishingly so, hydrogen peroxide is unsuitable for the prior art CMP slurry. Nothing is said about the silicon dioxide MRR and the copper over oxide selectivity.

However, it would be highly desirable to have CMP slurries available which can be tuned to exhibit high copper, silicon and silicon dioxide MRRs and copper over silicon selectivity of close to 1 or 1 and silicon dioxide over copper selectivity of greater than 1.

The American patent application US 2001/0054706 A1 discloses an etching solution for planarizing copper surfaces with a spin etch planarization process. The etching solution does not contain abrasives. It comprises oxidizing agents selected from hydrogen peroxide and nitric acid, depassivating co-reactants selected from the group consisting of phosphoric acid, sulfuric acid, nitric acid, oxalic acid, acetic acid and organic acids, and diffusion controlling additives such as 1,2,4-triazole, 1,2,3-triazole and tetrazole.

The American patent U.S. Pat. No. 6,974,777 B2 discloses CMP slurries for polishing substrates having low-k dielectric films of the dielectric constant of about 3.5 or lower, the said CMP slurries comprising abrasives, amphiphilic nonionic surfactants, oxidizing agent such as hydrogen peroxide or persulfates, complexing and chelating agents and corrosion inhibitors such as 1,2,3-triazole, 1,2, 4-triazole and benzotriazole. The CMP slurries have a pH of 6 to 12. The amphiphilic nonionic surfactants can reduce the MRR of the low-k dielectric films while leaving the MRRs of other metal or oxide films substantially unchanged. The use of the CMP slurries in processes for through-base wafer vias, in particular TSV, is not described.

The American patent U.S. Pat. No. 6,936,543 B2 discloses CMP slurries for polishing substrates having copper films. The said CMP slurries have the same or a similar composition as the CMP slurries disclosed in the U.S. Pat. No. 6,974,777 B2. They reduce the dishing and the dielectric erosion of copper. They increase the copper over oxide selectivity while leaving the copper over tantalum selectivity substantially unchanged. The use of the CMP slurries in processes for through-base wafer vias, in particular TSV, is not described.

OBJECTS OF THE INVENTION

It was the object of the present invention to provide a novel method for manufacturing semiconductor wafers having at least one through-base wafer via, in particular, at least one through-silicon via (TSV), which method should no longer exhibit the disadvantages and drawbacks of the prior art methods.

The novel method should yield semiconductor wafers having at least one through-base wafer via, in particular, at least one TSV, in high yields and should be excellently reproducible. More particularly, the novel method should dispense with a grinding step during the thinning of the semiconductor wafers and should exhibit high copper and semiconductor, in particular, silicon, MRRs and a copper over semiconductor, in particular, silicon, selectivity of close to 1 and ideally 1. Moreover, the novel method should be tunable so that a high silicon oxide dielectric material MRR and an oxide over cooper selectivity of greater than 1 can be achieved.

Additionally, the novel method should significantly reduce the dishing and the erosion of copper.

The semiconductor wafers having at least one through-base wafer via, in particular, at least one TSV, should be most excellently suited for manufacturing three-dimensionally integrated circuit devices comprising at least two electrically conductively connected stacked semiconductor wafers each having at least one through-base wafer via, in particular at least one TSV.

SUMMARY OF THE INVENTION

Accordingly, the novel method for manufacturing semiconductor wafers having at least one through-base wafer via has been found, the said method comprising the steps of (1) providing a semiconductor wafer having at least one electrically conductive via comprising at least one electrically conductive metal and extending from the front side of the semiconductor wafer at least partially through the semiconductor wafer;
(2) affixing the frontside of the semiconductor wafer to a carrier;
(3) contacting the backside of the semiconductor wafer with a polishing pad and an aqueous chemical mechanical polishing composition having a pH of equal to or greater than 9 and comprising
    (A) at least one type of of abrasive particles;
    (B) at least one oxidizing agent containing at least one peroxide group; and
    (C) at least one additive acting both as metal chelating agent and metal corrosion inhibitor;
(4) chemically mechanically polishing the backside of the semiconductor wafer until at least one electrically conductive via is exposed.

Hereinafter, the novel method for manufacturing semiconductor wafers having at least one through-base wafer via is referred to as the "method of the invention".

ADVANTAGES OF THE INVENTION

In view of the prior art, it was surprising and could not be expected by the skilled artisan that the objects of the present invention could be solved by the method and the use of the invention.

It was particularly surprising that the method of the invention no longer exhibited the disadvantages and drawbacks of the prior art methods.

The method of the invention yielded semiconductor wafers having at least one through-base wafer via, in particular, at least one TSV, in high yields and was excellently reproducible. More particularly, the method of the invention dispensed with a grinding step during the thinning of the semiconductor wafers and exhibited high copper and semiconductor, in particular, silicon, MRRs and a copper over semiconductor, in particular, silicon, selectivity of close to 1 and ideally 1. Moreover, the method of the invention was tunable so that a high silicon oxide dielectric material MRR and a oxide over copper selectivity of higher than 1 was achieved, too.

It was most surprising that the high MRRs could be achieved with comparatively low downforces during CMP.

Additionally, the method of the invention significantly reduced the dishing and the erosion of copper.

The semiconductor wafers having at least one through-base wafer via, in particular, at least one through-silicon via (TSV), manufactured in accordance with the method of the invention were most excellently suited for manufacturing three-dimensionally integrated circuit devices comprising at least two electrically conductively connected stacked semiconductor wafers each having at least one through-base wafer via, in particular at least one through-silicon via (TSV).

DETAILED DESCRIPTION OF THE INVENTION

The method of the invention is used for manufacturing semiconductor wafers having at least one, preferably more than one, through-based wafer via.

In the first step of the method of the invention, there is provided a semiconductor wafer, preferably, a silicon or silicon alloy wafer, more preferably a silicon wafer and, most preferably, a silicon wafer having at least one electrically conductive via comprising at least one electrically conductive metal.

Preferably, standard semiconductor wafers customarily used for the manufacture of IC devices having large-scale integration (LSI), very large-scale integration (VLSI) and ultra large-scale integration (ULSI) are used.

In principle, any metal customarily used for manufacturing IC devices, in particular three-dimensionally integrated IC devices can be used. Preferably, the metal is selected from the group consisting of vanadium, niobium, tantalum, chromium, molybdenum, tungsten, rhenium, ruthenium, osmium, rhodium, iridium, palladium, platinum, copper, silver and gold, their alloys containing at least two of the said metals and their alloys containing at least one of the said metals and at least one metal which is different from the said metals. More preferably, the metal is selected from tungsten and copper. Most preferably, copper is used.

The electrically conductive via extends from the frontside of the semiconductor wafer at least partially, preferably partially, through the semiconductor wafer. If the electrically conductive via extends partially through the semiconductor wafer, its extension is preferably at least 50%, more preferably at least 60% and most preferably at least 80% of the semiconductor wafer thickness. Preferably, the maximum extension is 95% of the semiconductor wafers thickness.

The electrically conductive vias can have various cross-sections. Thus, the cross-sections can be selected from the group consisting of squares, rectangles, trapeziums, triangles, pentagons, hexagons, circles and ellipses.

The largest diameter of a given cross-section, as for example, the diameter of a circle, the diagonal of a square or a rectangle or the longest side of a triangle, can vary broadly and, therefore, can be adjusted most advantageously to the particular requirements of the three-dimensionally integrated IC devices Preferably, the largest diameter of the cross-sections is in the range of from 2 to 200, preferably 2 to 150 and most preferably, 2 to 100 µm.

The cross-section of a given electrically conductive via can vary with its depth, i.e., the cross-section can decrease. Preferably the cross-section remains the same or essentially the same.

Except for the areas where the top ends of the electrically conductive vias are exposed, the frontside of the semiconductor wafer can be a blank silicon surface.

The frontside can also carry patterned or unpatterned films consisting of or containing materials customarily used in the manufacture of IC devices. These patterned or unpatterned films may or may not cover the top ends of the electrically conductive vias completely.

Preferably, such patterned or unpatterned films consist of or contain silicon oxide dielectric materials, in particular silicon dioxide materials and low-k and ultra low-k dielectric materials.

Suitable silicon dioxide materials can be preprepared by low-pressure and high-pressure plasma chemical vapor deposition (LDP or HDP CVD) using monosilane-oxygen or tetraethylorthosilicate (TEOS)-oxygen plasmas as described in, for example, the American patent application US 2007/0175104 A1, page 7, paragraph [0092].

Suitable low-k or ultra-low-k materials and suitable methods of preparing the insulating dielectric films are described, for example, in the American patent applications US 2005/0176259 A1, page 2, paragraphs [0025] to [0027], US 2005/0014667 A1, page 1, paragraph [0003], US 2005/0266683 A1, page 1, paragraph [0003] and page 2, paragraph [0024] or US 2008/0280452 A1, paragraphs [0024] to [0026] or in the American patent U.S. Pat. No. 7,250,391 B2, column 1, lines 49 to 54 or in the European patent application EP 1 306 415 A2, page 4, paragraph [0031].

Moreover, the frontside can carry ICs.

Preferably, the frontside which is not a blank silicon surface

In the second step of the method of the invention, the semiconductor wafer is affixed to a carrier. The fixation is accomplished in such a way that the frontside of the semiconductor wafer is not affected and that the connection between the frontside and the carrier is not loosened during the CMP of the backside of the semiconductor wafer but can be cut easily after the CMP without affecting the polished semiconductor wafer. Equipment and materials for accomplishing the fixation are well-known in the art.

In the third step of the method of the invention, the backside of the semiconductor wafer is contacted with a polishing pad and an aqueous chemical mechanical polishing composition or CMP slurry.

The CMP slurry to be used in the method of the invention is an aqueous composition. This means that it contains water, in particular ultrapure water, as the main solvent and dispersing agent. Nevertheless, the CMP slurry may contain at least one of the water-miscible organic solvents (D) hereinafter described, however, only in minor amounts that do not change the aqueous nature of the CMP slurry.

Preferably, the CMP slurry contains water in amounts of from 60 to 99.95% by weight, more preferably 70 to 99.9% by weight, even more preferably 80 to 99.9% by weight and, most preferably, 90 to 99.9% by weight, the weight percentages being based on the complete weight of the CMP slurry.

The pH of the CMP slurry is adjusted to equal to or greater than 9, preferably, equal to or greater than 10 and, most preferably, greater than or equal to 10.5. Preferably, the pH adjusting agents (D) hereinafter described are used for adjusting the pH. Preferably, the maximum pH is 13 and, most preferably, 12.5.

"Water-soluble" means that the relevant component or ingredient of the CMP slurry can be dissolved in the aqueous phase on the molecular level.

"Water-dispersible" means that the relevant component or ingredient of the CMP slurry can be dispersed in the aqueous phase and forms a stable emulsion or suspension.

The first essential ingredient of the CMP slurry is at least one, preferably one type of abrasive particles (A).

The abrasive particles (A) can be organic or inorganic particles. The average primary particle size of the abrasive particles (A) can vary broadly and, therefore, can be adjusted most advantageously to the particular requirements of a given composition and process of the invention. Preferably, the average primary particle size as determined by dynamic laser light scattering is in the range of from 1 to 2000 nm, mor preferably, 1 to 1000 nm, even more preferably, 1 to 750 and, most preferably, 1 to 500 nm. The primary particles can also be aggregated forming secondary aggregates.

The particle size distribution of the abrasive particles (A) can be monomodal, bimodal or multimodal. Preferably, the particle size distribution is monomodal in order to have an easily reproducible property profile of the abrasive particles (A) and easily reproducible conditions during the process of the invention.

Moreover, the particle size distribution of the abrasive particles (A) can be narrow or broad. Preferably, the particle size distribution is narrow with only small amounts of small particles and large particles in order to have an easily reproducible property profile of the abrasive particles (A) and easily reproducible conditions during the process of the invention.

The abrasive particles (A) can have various shapes. Thus, they may be of one or essentially one type of shape. However, it also possible that the abrasive particles (A) have different shapes. In particular, two types of differently shaped abrasive particles (A) may be present in a given CMP slurry. As regards the shapes themselves, they can be cubes, cubes with chamfered edges, octahedrons, icosahedrons, nodules and spheres with or without protrusions or indentations. Most preferably, the shape is spherical with no or only very few protrusions or indentations. This shape, as a rule, is preferred because it usually increases the resistance to the mechanical forces the abrasive particles (A) are exposed to during a CMP process.

Preferably, inorganic abrasive particles (A) are used.

More preferably, the inorganic abrasive particles (A) are selected from the group consisting of metal oxides, metal carbides, metal borides, co-formed products thereof, and mixtures thereof. Even more preferably, metal oxides are used as the inorganc abrasive particles (A).

Preferably, the metal oxides (A) are selected from the group of particles containing or consisting of silica, alumina, titania, zirconia, germania, ceria, co-formed products thereof and mixtures thereof Most preferably, silica is used as the inorganic abrasive particles (A).

The amount of the inorganic abrasive particles (A) used in the CMP slurry can vary broadly and, therefore, can be adjusted most advantageously to the particular requirements of a given composition and process of the invention. Preferably, the CMP slurry contains 0.005 to 30% by weight, more preferably 0.01 to 25% by weight and, most preferably 0.01 to 20% by weight of the abrasive particles (A), the weight percentages being based on the complete weight of the CMP slurry.

The second essential component of the CMP slurry to be used in the method of the invention is at least one, preferably one, oxidizing agent (B) containing at least one, preferably one, peroxide group.

The peroxides (B) can be organic or inorganic peroxides.

Examples for suitable organic peroxides (B) are benzoyl peroxide, di-tert-butyl peroxide and peracetic acid.

Examples for suitable inorganic peroxides (B) are hydrogen peroxide, urea hydrogen peroxide adduct and percarbonates, perborates, monopersulfates and dipersulfates and their corresponding acids.

Preferably, hydrogen peroxide, monopersulfates and dipersulfates are used as oxidizing agents (B).

More preferably, monopersulfates and dipersulfates, even more preferably, monopersulfates and, most preferably, potassium monopersulfate is or are used as the oxidizing agent (B), when the semiconductor wafer, in particular, the silicon wafer, comprises a silicon oxide dielectric film, in particular, a silicon dioxide film.

More preferably, hydrogen peroxide, monopersulfates and dipersulfates, even more preferably, monopersulfates and, most preferably, potassium monopersulfate is or are used as the oxidizing agent or agents (B) for the CMP of the electrically conductive metal film, in particular, a copper film, and the semiconductor material, in particular, silicon.

The third essential component of the CMP slurry to be used in the method of the invention is at least one, preferably one, additive (C) acting both as metal chelating agent and metal corrosion inhibitor.

As is known in the field of CMP, a metal chelating agent customarily increases the metal static etch rate SER of a CMP slurry as compared with the metal SER of a CMP slurry containing no such metal chelating agent. This increase in metal SER usually causes an increase in metal MRR during CMP.

Contrary to this, a metal corrosion inhibitor decreases the metal SER of the CMP slurry as compared with a metal SER of a CMP slurry containing no such metal corrosion inhibitor. This decrease in metal SER usually causes a decrease in metal MRR during CMP.

Surprisingly, the additive (C) acting both as metal chelating agent and metal corrosion inhibitor decreases the metal SER but, nevertheless, increases the metal MRR of a CMP slurry as compared with the metal SER and MRR of CMP slurry not containing the additive (C).

In principle, any compound exhibiting the above mentioned chemical and physicochemical properties can be used as the additive (C) as long as it is stable under the physical and chemical conditions of the preparation, the storage and the handling of the respective CMP slurry and the use of the respective CMP slurry in the method of the invention. Moreover, the compound (C) should not cause agglomeration and sedimentation of the CMP slurry.

Preferably, the additive (C) is selected from the group consisting of 1,2,3-triazole and tetrazole. Most preferably, 1,2,3-triazole is used as the additive (C).

The concentration of the additive (C) in the CMP slurry to be used in the method of the invention can vary broadly and, therefore, can be adapted as most advantageously to the particular requirements of a given method of the invention. Preferably, the additive (C) is used in amounts of from 0.05 to 5% by weight, preferably, 0.1 to 4% by weight, even more preferably, 0.1 to 3% by weight and, most preferably, 0.1 to 2% by weight, the weight percentages being based on the complete weight of the CMP slurry.

The CMP slurry to be used in the method of invention can contain at least one functional component (D) which is different from the ingredients or components (A), (B) and (C).

Preferably, the functional component (D) is selected from the group consisting of surfactants, polyhydric alcohols with at least two hydroxy groups, materials having a lower critical solution temperature LOST, materials having an upper critical solution temperature UCST, oxidizing agents passivating agents, complexing or chelating agents, frictive agents, stabilizing agents, metal corrosion inhibitors, pH-adjusting agents, buffering agents, tantalum nitride enhancers, rheology agents, metal cations, fluorine containing compounds, charge reversal agents and water-miscible organic solvents.

Suitable surfactants (D) and their effective amounts are known, for example, from the international patent application WO 2005/014753 A1, page 8, line 23, to page 10, line 17 or from the American patent U.S. Pat. No. 7,300,601 B2, column 5, line 4 to column 6, line 8.

Preferred surfactants (D) are non-ionic surfactants selected from the group consisting of linear and branched alkylene oxides, preferably ethyleneoxide and propyleneoxide, homopolymers and copolymers.

The preferred ethyleneoxide-propyleneoxide copolymers (D) can be random copolymers, alternating copolymers or block copolymers containing polyethyleneoxide blocks and polypropyleneoxide blocks.

Preferably, in the ethyleneoxide-propyleneoxide blockcopolymers (D), the polyethyleneoxide blocks have hydrophile-lipophile-balance (HLB) values from 10 to 15. The polypropyleneoxide blocks may have a HLB values of from 28 to about 32

The preferred surfactants (D) are customary and known, commercially available materials and are described in the European patent EP 1 534 795 B1, page 3, paragraph [0013] to page 4, paragraph [0023], the Japanese patent application JP 2001-240850 A, claim 2 in conjunction with the paragraphs [0007] to [0014], the American patent application US 2007/0077865 A1, column page 1, paragraph [0008] to page 2, paragraph [0010], the American patent application US 2006/0124594 A1, page 3, paragraphs [0036] and [0037] and the American patent application US 2008/0124913 A1, page 3, paragraphs [0031] to [0033] in conjunction with the claim 14 or they are sold under the trademarks Pluronic™ Tetronic™ and Basensol™ by BASF Corporation and BASF SE as evidenced by the company brochure of BASF Corporation "Pluronic™ & Tetronic™ Block Copolymer Surfactants, 1996" or the American patent US 2006/0213780 A1.

Most preferably, polyethylene glycol (PEG) is used as nonionic surfactant (D).

Examples of suitable polyhydric alcohols (D) having two hydroxy groups are ethylene glycol, propylene glycol, butylene glycol, pentylene glycol, hexylene glycol, diethylene glycol, triethylene glycol, dipropylene glycol, tripropylene glycol, ethylene propylene glycol, diethylene propylene glycol, ethylene dipropylene glycol, 1,2-, 1,3- and 1,4-dihydroxy cyclohexane and benzene, and bisphenol A and F.

Examples of suitable polyhydric alcohols (D) having three hydroxy groups are glycerol, 1,2,3-trihydroxy-n-butane, trimethylolpropane, 1,2,3-, 1,2,4- and 1,3,5-trihydroxy cyclohexane and benzene.

Examples of suitable polyhydric alcohols (D) having more three hydroxy groups are pentaerythritol, 1,2,3,4-, 1,2,3,5- and 1,2,4,5-tetrahydroxy cyclohexane and benzene, alditols, cyclitols, carbohydrates and dimers and oligomers of glycerol, trimethylolpropane, pentaerythritol, alditols, cyclitols and carbohydrates.

Examples of suitable alditols (D) are tetritols, pentitols, hexitols, heptitols, and octitols, in particular, erythritol, threitol, arabinitol, ribitol, xylitol, galactitol, mannitol, glucitol, allitol, altritol and iditol.

Examples of suitable dimers (D) are dimers of glycerol, trimethylolpropane, erythritol, threitol and pentaerythritol, maltitol, isomalt and lactitol, in particular, tri-, tetra-, penta-, hexa-, hepta-, octa-, nona-, deca-, undeca- and dodecaglycerol, -trimethylolpropane, -erythritol, -threitol and -pentaerythritol.

Examples of suitable cyclitols (D) are 1,2,3,4-tetrahydroxycyclohexane, 1,2,3,4,5-pentahydroxycyclohexane and inositols, in particular myo-, scyllo-, muco-, chiro-, neo-, allo-, epi- and cis-inositol.

Examples of suitable carbohydrates (D) are monosaccharides, disaccharides, desoxy sugars and amino sugars, in particular, monosaccharides and disaccharides.

Examples of suitable monosaccharides (D) are allose, altrose, glucose, mannose, idose, galactose and talose.

Examples of suitable disaccharides (D) are cellobiose, gentiobiose, isomaltose, lactose, lactulose, maltose, maltulose, melibiose, neohesperidose, neotrehalose, nigerose, isomaltulose, rutinose, saccharose, sophorose and trehalose.

Suitable materials (D) exhibiting a lower critical solution temperature LOST or an upper critical solution temperature UCST are described, for example, in the article of H. Mori, H. Iwaya, A. Nagai and T. Endo, Controlled synthesis of thermoresponsive polymers derived from L-proline via RAFT polymerization, in Chemical Communication, 2005, 4872-4874; or in the article of D. Schmaljohann, Thermo- and pH-responsive polymers and drug delivery, Advanced Drug Delivery Reviews, volume 58 (2006), 1655-1670 or in the American patent applications US 2002/0198328 A1, US 2004/0209095 A1, US 2004/0217009 A1, US 2006/0141254 A1, US 2007/0029198 A1, US 2007/0289875 A1, US 2008/0249210 A1, US 2008/0050435 A1 or US 2009/0013609 A1, the American patents U.S. Pat. No. 5,057,560, U.S. Pat. No. 5,788,82 and U.S. Pat. No. 6,682,642 B2, the international patent applications WO 01/60926 A1, WO 2004/029160 A1, WO 2004/0521946 A1, WO 2006/093242 A2 or WO 2007/012763 A1, in the European patent applications EP 0 583 814 A1, EP 1 197 587 B1 and EP 1 942 179 A1, or the German patent application DE 26 10 705.

Suitable oxidizing agents (D) are compounds containing an element in a high or in the highest oxidation state, ozone and elemental fluorine.

Examples of suitable compounds (D) containing an element in a high or in the highest oxidation state are chlorates, perchlorates, bromates, perbromates, iodates, periodates, nitrates, chromates, permanganates and their corresponding acids, osmium tetraoxide, silver oxide, and iron and copper salts.

Suitable passivating agents (D), which are also referred to as corrosion inhibitors, and their effective amounts are known, for example, from the American patent U.S. Pat. No. 7,300,601 B2, column 3, line 59 to column 4, line 9, from the American patent application US 2008/0254628 A1, the paragraph [0058] bridging the pages 4 and 5 or from the European patent EP 1 534 795 B1, page 5, paragraph [0031].

Suitable complexing or chelating agents (D), which are sometimes also designated as frictive agents (cf. the American patent application US 2008/0254628 A1, page 5, paragraph [0061]) or etching agents or etchants (cf. the American patent application US 2008/0254628 A1, page 4, paragrap [0054]), and their effective amounts are known, for example, from the American patent U.S. Pat. No. 7,300,601 B2, column 4, lines with 35 to 48 or from the European patent EP 1 534 795 B1, page 5, paragraph [0029]. The amino acids, in particular glycine and L-histidine, and carboxylic acids such as tartaric acid, citric acid, phthalic acid and malonic acid can be preferably used as complexing or chelating agents (D).

Suitable stabilizing agents (D) and their effective amounts are known, for example, from the American patent U.S. Pat. No. 6,068,787, column 8, lines 4 to 56.

Suitable metal corrosion inhibitors (D) and their effective amounts are known, for example, from the American patent application US 2010/00812798 A1, page 5, paragraphs [0068] and [0069].

Suitable pH-adjusting agents and buffering agents (D) and their effective amounts are known, for example, from the European patent application EP 1 036 836 A1, page 8, paragraphs [0080], [0085] and [0086], the international patent application WO 2005/014753 A1, page 12, lines 19 to 24, the American patent application US 2008/0254628 A1, page 6, paragraph [0073] or the American patent U.S. Pat. No. 7,300,601 B2, column 5, lines 33 to 63.

Suitable tantalum nitride enhancers (D) are low molecular carboxylic acids such as acetic acid, oxalic acid and malonic acid, in particular malonic acid.

Suitable rheology agents (D) and their effective amounts are known, for example, from the American patent application US 2008/0254628 A1, page 5, paragraph [0065] to page 6, paragraph [0069].

Suitable polyvalent metal ions (D) and their effective amounts are known, for example, from the European patent application EP 1 036 836 A1, page 8, paragraph [0076] to page 9, paragraph [0078].

Suitable fluorine containing compounds (D) and their effective amounts are known, for example, from the American patent application US 2010/00812798 A1, page 5, paragraph [0070].

In principle, any known charge reversal agent (D) customarily used in the field of CMP can be used. Preferably, the charge reversal agent (D) is selected from the group consisting of monomeric, oligomeric and polymeric compounds containing at least one anionic group selected from the group consisting of carboxylate, sulfinate, sulfate, phosphonate and phosphate groups.

Preferably, anionic phosphate dispersing agents, in particular water-soluble condensed phosphates, are used as the charge reversal agents (D).

Examples of suitable water-soluble condensed phosphates (D) are salts, in particular ammonium, sodium and potassium salts, of metaphosphates of the general formula I:

$$[M^+{}_n(PO_3)_n] \quad (I);$$

and polyphosphates of the general formula II and III:

$$M^+{}_nP_nO_{3n+1} \quad (II);$$

$$M^+H_2P_nO_{3n+1} \quad (III);$$

wherein M is ammonium, sodium and potassium and the index n is from 2 to 10,000.

Examples for particularly suitable water-soluble condensed phosphates (D) are Graham's salt $(NaPO_3)_{40-50}$, Calgon™ $(NaPO_3)_{15-20}$, Kurrol's salt $(NaPO_3)_n$ with n=about 5000, and ammonium, sodium and potassium hexametaphosphate.

Suitable water-miscible organic solvents (D) and their effective amounts are known, for example, from the American patent U.S. Pat. No. 7,361,603 B2, column 7, lines 32 to 48 or the American patent application US 2008/0254628 A1, page 5, paragraph [0059].

The preparation of the CMP slurry to be used in a method of the invention does not exhibit any particularities but can be carried out by dissolving or dispersing the above-described ingredients (A), (B) and (C) and optionally (D) in an aqueous medium, in particular, de-ionized water. For this purpose, the customary and standard mixing processes and mixing apparatuses such as agitated vessels, in-line dissolvers, high shear impellers, ultrasonic mixers, homogenizer nozzles or counterflow mixers, can be used. Preferably, the CMP slurry thus obtained can be filtered through filters of the appropriate mesh aperture, in order to remove coarse-grained particles such as the agglomerates or aggregates of the solid, finely dispersed abrasive particles (A).

In the fourth step of the method of the invention, the backside of the semiconductor wafer is chemically mechanically polished until at least one electrically conductive via and, preferably, all electrically conductive vias is or are exposed.

As is known in the art, a typical equipment for the CMP consists of a rotating platen which is covered with a polishing pad. The wafer is mounted on a carrier or chuck with its upper side down facing the polishing pad. The carrier secures the wafer in the horizontal position. This particular arrangement of polishing and holding device is also known as the hard-platen design. The carrier may retain a carrier pad which lies between the retaining surface of the carrier and the surface of the wafer which is not being polished. This pad can operate as a cushion for the wafer.

Below the carrier, the larger diameter platen is also generally horizontally positioned and presents a surface parallel to that of the wafer to be polished. Its polishing pad contacts the wafer surface during the planarization process. During the CMP process of the invention, the composition of the invention is applied onto the polishing pad as a continuous stream or in dropwise fashion.

Both the carrier and the platen are caused to rotate around their respective shafts extending perpendicular from the carrier and the platen. The rotating carrier shaft may remain fixed in position relative to the rotating platen or may oscillate horizontally relative to the platen. The direction of rotation of the carrier typically, though not necessarily, is the same as that of the platen. The speeds of rotation for the carrier and the platen are generally, though not necessarily, set at different values.

Customarily, the temperature of the platen is set at temperatures between 10 and 70° C.

For further details reference is made to the international patent application WO 2004/063301 A1, in particular page 16, paragraph [0036] to page 18, paragraph [0040] in conjunction with the FIG. 1.

Preferably, the backside of the semiconductor wafer is chemically mechanically polished at a silicon MRR of at least 5000 Å/min (500 nm/min) at a downforce of 4 psi (234.3 mbar) or less.

Preferably, the backside of the semiconductor wafer is chemically mechanically polished at a copper MRR of at least 5000 Å/min (500 nm/min) at a downforce of 4 psi (234.3 mbar) or less.

Preferably, the backside of the semiconductor wafer is chemically mechanically polished at a silicon oxide dielectric MRR of at least 3000 Å/min (300 nm/min) at a downforce of 4 psi (234.3 mbar) or less.

More preferably, the backside of the semiconductor wafer is chemically mechanically polished so that a copper over a silicon selectivity of close to 1 and ideally 1 is achieved.

More preferably, the backside of the semiconductor wafer is chemically mechanically polished so that an oxide over copper selectivity of greater than 1 is achieved.

EXAMPLES AND COMPARATIVE EXPERIMENTS

Example 1 and Comparative Experiments C1 and C2

1,2,3-Triazole as Copper Inhibitor

The CMP slurries 1.1 to 1.15 (Examples 1.1 to 1.15) were prepared by dissolving and dispersing their components in ultrapure water. The pH of the CMP slurries 1.1 to 1.15 was adjusted with potassium hydroxide. The components and the amounts used are compiled in the Table 1.

The CMP slurries C1 and C2 (Comparative Experiments C1 and C2) were prepared in the same way only that no 1,2,3-triazole and additional inhibitors were added.

The static etch rate (SER or HSER) of the CMP slurries 1.1 to 1.15 (Examples 1.1 to 1.15) and the CMP slurries C1 and C2 (Comparative Experiments C1 and C2 was determined as follows:

Copper discs were conditioned by polishing all surfaces on a very fine sand paper grade 200 or above in the presence of diluted hydrochloric solution. Then, the polished discs were washed with deionized water, rinsed with isopropyl alcohol, dried by compressed air-blow drying and weighed before each experiment. The copper discs were then held by a pair of Teflon covered tongs to reduce contamination and were then directly immersed in the stirred CMP slurries 1.1 to 1.8 and CMP slurries C1 and C2 at 20° C. to determine the static etch rate (SER). Additionally, the copper discs were immersed in the CMP slurries 1.9 to 1.15 at 50° C. to determine the hot static etch rate (HSER). The time of immersion was 5 minutes in each case. After the etching, the copper discs were cleaned with deionized water followed by an isopropyl alcohol rinse. Thereafter, the copper discs were dried with a steady stream of pressurized air, and the SER was calculated on the net weight-loss and the surface area of the disc using the following calculation:

SER=Weight-loss/[Density×(Circumferential Area+ 2×Area of Cross-section)×Time], wherein
Weight-loss=loss of weight in copper disc after dissolution;
Density=density of copper;
Area of Cross-section=cross-section area of the disc;
Circumferential Area=circumferential area of the disc; and
Time=dissolution time.

The SERs of the CMP slurries 1.1 to 1.8 and C1 and C2 and the HSERs of the CMP slurries 1.9 to 1.15 are also compiled in the Table 1.

Measurements of the silica particle size distribution by dynamic laser light scattering showed no increase of the average particle size in the 1,2,3-triazole containing CMP slurries 1.1 to 1.15 even after a shelflife of 63 days.

The data compiled in the Table 1 make apparent that 1,2,3-triazole exhibited a strong inhibiting effect both in the presence of hydrogen peroxide or potassium persulfate as exemplified by a copper dissolution rate or SER of 0 nm/min or a slightly negative dissolution rate or SER (cf. the CMP slurries 1.1 to 1.8). The negative SER showed that an inhibitor film had formed on top of the copper surface.

Likewise, 1,2,3-triazole exhibited a strongly negative HSER in the presence of potassium persulfate. Again, the strongly negative HSER showed that an inhibitor film had formed on top of the copper surface (cf. the CMP slurry 1.9). However, the inhibiting effect of 1,2,3-triazole was counterbalanced by a higher concentration of potassium persulfate (cf. the CMP slurry 1.10). The HSER of 1,2,3-triazole could be significantly increased (cf. the CMP slurries 1.11 to 1.13 and 1.15) or modified (cf. the CMP slurry 1.14) by adding customary and known copper inhibitors.

TABLE 1

The Compositions of the CMP Slurries 1.1 to 1.8 and C1 and C2 and Their Static Etch Rate (SER) at 20° C. and the Compositions of the CMP Slurries 1.9 to 1.15 and Their Hot Static Etch Rate (HSER) at 50° C.

| | Silica/% by weight | 1,2,3-Triazole/% by weight | Additional Inhibitor/% by weight | Chelating Agent (Gycine)/% by weight | KPS/% by weight | $H_2O_2$/% by weight | pH | SER/ nm/min | HSER/ Å/min |
|---|---|---|---|---|---|---|---|---|---|
| CMP Slurry No. | | | | | | | | | |
| 1.1 | 10[a] | 1 | — | — | — | 0.5 | 11 | 0 | — |
| 1.2 | 10[a] | 1 | — | — | — | 0.6 | 11 | 0 | — |
| 1.3 | 10[a] | 1 | — | — | — | 0.7 | 11 | 0 | — |
| 1.4 | 10[a] | 1 | — | — | — | 0.8 | 11 | 0 | — |
| 1.5 | 10[a] | 1 | — | — | — | 0.9 | 11 | 0 | — |
| 1.6 | 10[a] | 1 | — | — | — | 1 | 11 | 0 | — |
| 1.7 | 10[a] | 1 | — | — | 0.5 | — | 11 | −2 | — |
| 1.8 | 10[a] | 1 | — | — | 1 | — | 11 | −2 | — |
| 1.9 | 10[b] | 0.3 | — | — | 0.6 | — | 11 | — | −37[c] |
| 1.10 | 10[b] | 0.3 | — | — | 1 | — | 11 | — | 66[c] |
| 1.11 | 10[b] | 0.3 | 1,2,4-Triazole/ 0.05 | — | 0.6 | — | 11 | — | −103 |
| 1.12 | 10[b] | 0.3 | BIA[d]/ 0.05 | — | 0.6 | — | 11 | — | −111 |
| 1.13 | 10[b] | 0.3 | BTA[e]/ 0.05 | — | 0.6 | — | 11 | — | −107 |
| 1.14 | 10[b] | 0.3 | Korantin ™ PM[f]/ 0.05 | — | 0.6 | — | 11 | — | −17 |
| 1.15 | 10[b] | 0.3 | Korantin ™ MAT[g]/ 0.05 | — | 0.6 | — | 11 | — | −157 |
| Comparative CMP Slurry No. | | | | | | | | | |
| C1 | 10[b] | — | — | 0.1?? | 0.6 | — | 11 | 185 | — |
| C2 | 10[b] | — | — | 0.1?? | — | 1 | 11 | 249 | — |

[a]high purity fumed silica Aerosil ™ from Evonic (primary average particle size 30 nm and 120 nm secondary particle size after dispersion);
[b]N125K silica from NYACOL (primary average particle size 85 nm);
[c]the CMP slurries 1.9 and 1.10 had been stored after their preparation for 7 days without change of pH;
[d]benzoimidazole;
[e]benzotriazole;
[f]corrosion inhibitor of BASF SE (propargyl alcohol alkoxylate);
[g]corrosion inhibitor of BASF SE (alkanolamine salt of nitrogen-containing organic acid)

It could be corroborated by atomic force microscopy (AFM) that the inhibitor film causing the weight increase was formed by copper passivation nails which were removed during CMP.

Contrary to this, the comparative CMP slurries C1 and C2 containing no 1,2,3-triazole but the prior art metal chelating agent glycine exhibited a considerably higher SER.

Example 2

The Material Removal Rates (MRRs) of the CMP Slurries 1.9 and 1.11 to 1.15 of Example 1 and of the Comparative CMP Slurry C1

The silicon and copper MRRs of the CMP slurries 1.9 and 1.11 to 1.15 of the example 1 and the comparative CMP slurry C1 of the comparative experiment C1 were determined under the following conditions:
200 mm copper wafers;
200 mm copper slugs;
200 mm silicon wafers;
Polishing apparatus: Strasbaugh 6EG nHance polisher;
platen speed: 115 rpm;
carrier speed: 105 rpm;
polishing pad: IC1010-k groove pad;
pad conditioning: in-situ;
conditioner: 3M S60;
conditioning downforce: 7 lbf (31.13 N);
4 dummy wafers before CMP
slurry flow rate: 200 ml/min;
polishing downforce: 3 psi (175.71 mbar);
back pressure at-sign both zones: 3 psi (175.71 mbar);
polishing time: 60 seconds.

The MRRs of the copper slugs and the silicon wafers were determined by measuring the weight of the copper slugs and the silicon wafers before and after CMP. The MRRs of the copper wafers were determined by 4-point-probe measurements of the copper thin-film resistivity and then converted to thickness before and after CMP. The MRRs obtained and the calculated selectivities are compiled in the Table 2.

TABLE 2

The Material Removal Rates (MRRs) of Silicon and Copper and the Calculated Copper over Silicon Selectivity

| CMP Slurry No. | Silicon MRR/Å/min | | Copper MRR/Å/min | | Copper over Silicon Selectivity | |
|---|---|---|---|---|---|---|
| | Run 1[a] | Run 2[b] | Run 1 | Run 2 | Run 1 | Run 2 |
| 1.9 | 8000 | 8000 | 9000 | 9000 | 1 | 1 |
| 1.11 | 7990 | 8400 | 8990 | 8990 | 1.12 | 1.07 |
| 1.12 | 6400 | 6400 | 8990 | 9000 | 1.4 | 1.4 |
| 1.13 | 7990 | 7990 | 7400 | 7200 | 0.92 | 0.9 |
| 1.14 | 6300 | 6300 | 7990 | 8400 | 1.27 | 1.33 |
| 1.15 | 5000 | 5000 | 8200 | 7400 | 1.64 | 1.48 |

[a]copper slug;
[b]copper wafer;

Although Example 1 demonstrated that 1,2,3-triazole had a significant inhibiting effect, the copper MMR could be significantly increased by adding this compound. Therefore, 1,2,3-triazole acted both as a copper corrosion inhibitor and a copper chelating agent.

The additional inhibitor 1,2,4-triazole did not influence the silicon and copper MRRs significantly. BIA caused a drop of the silicon MRR but did not influence the copper MRRs significantly. BTA caused a drop of the Copper MRR but did not influence the silicon MRR. Korantin™ PM and Korantin™ MAT caused a slight drop of the copper MRR and a more pronounced drop of the silicon MRR.

Except for Korantin™ MAT, the additional inhibitors did not change the pH of the CMP slurries during a one-week potlife.

All the CMP slurries 1.9 and 1.11 to 1.15 caused very similar copper wafer MRR profiles, which profiles were flat in the majority of the middle/center parts of the wafers and dropped off at the very edge of the wafers.

Example 3

The Silicon and Copper MRRs of the CMP Slurries 3.1 to 3.2—Variation of the 1,2,3-Triazole Concentration The CMP slurries 3.1 to 3.3 were prepared by dissolving and dispersing their components in ultrapure water. The Table 3 shows the components and their amounts used.

TABLE 3

The Compositions of the CMP Slurries 3.1 to 3.3

| CMP Slurry No. | Silica/ % by weight | 1,2,3-Triazole/ % by weight | Potassium Persulfate/ % by weight | pH |
|---|---|---|---|---|
| 3.1 | 10 | 0.1 | 1 | 10.9-11 |
| 3.2 | 10 | 0.3 | 1 | 10.9-11 |
| 3.3 | 10 | 0.5 | 1 | 10.9-11 |

200 mm silicon wafers and 200 mm copper wafers were polished under the conditions and with the equipment described in the example 2. The MRRs obtained are compiled in the Table 4.

TABLE 4

The Silicon and Copper MRRs of the CMP Slurries 3.1 to 3.3

| CMP Slurry No. | Silicon MRR/Å/min | | | Copper MRR/Å/min | | |
|---|---|---|---|---|---|---|
| | Run 1 | Run 2 | Run 3 | Run 1 | Run 2 | Run 3 |
| 3.1 | 8200 | 8200 | 8200 | 5380 | 5380 | 5410 |
| 3.2 | 7930 | 7790 | 7930 | 9540 | 9750 | 9790 |
| 3.3 | 6560 | 6420 | 8200 | 9650 | 9930 | 10,000 |

The CMP slurries 3.1 to 3.3 showed stable silicon and copper MRRs for all 3 runs, except one run of 3.3 which run exhibited a higher silicon MRR than the other 2 runs. The increase of the 1,2,3-triazole concentration caused a slight decrease of the silicon MRR but an increase in the Copper MRR.

Example 4

The Silicon and Copper MRRs of the CMP Slurries 4.1 and 4.2—Variation of the Potassium Persulfate Concentration The CMP slurries 4.1 to 4.2 were prepared by dissolving and dispersing their components in ultrapure water. The Table 5 shows the components and their amounts used.

TABLE 5

The Compositions of the CMP Slurries 4.1 and 4.2

| CMP Slurry No. | Silica/ % by weight | 1,2,3-Triazole/ % by weight | Potassium Persulfate/ % by weight | pH |
|---|---|---|---|---|
| 4.1 | 10 | 0.5 | 1 | 10.9-11 |
| 4.2 | 10 | 0.5 | 2 | 10.9-11 |

200 mm silicon wafers and 200 mm copper wafers were polished under the conditions and with the equipment described in the Example 2. The MRRs obtained are compiled in the Table 6.

TABLE 6

The Silicon and Copper MRRs of the CMP Slurries 4.1 and 4.2

| CMP Slurry No. | Silicon MRR/Å/min | | | Copper MRR/Å/min | | |
|---|---|---|---|---|---|---|
| | Run 1 | Run 2 | Run 3 | Run 1 | Run 2 | Run 3 |
| 4.1 | 7930 | 7790 | 7930 | 9540 | 9750 | 9790 |
| 4.2 | 7930 | 7790 | 8340 | 11,500 | 11,500 | 11,430 |

The CMP slurry is 4.1 and 4.2 showed stable silicon and copper MRRs for all 3 runs. The increase of the potassium persulfate concentration did not have much impact on the silicon MRR, except for a slight increase. Contrary to this, the copper MRR increased significantly with increasing potassium persulfate concentration.

Example 5 and Comparative Experiment C3

The Silicon and Copper MRRs of the CMP Slurries 5 and C3—Variation of the pH

The CMP slurries 5 and C3 (comparative) were prepared by dissolving and dispersing their components in ultrapure water. The Table 7 shows the components and their amounts used.

TABLE 7

The Compositions of the CMP Slurries 5 and C3

| CMP Slurry No. | Silica/ % by weight | 1,2,3-Triazole/ % by weight | Potassium Persulfate/ % by weight | pH |
|---|---|---|---|---|
| 5 | 10 | 0.3 | 1 | 10.9 |
| C3 | 10 | 0.3 | 1 | 7.76 |

200 mm silicon wafers and 200 mm copper wafers were polished under the conditions and with the equipment described in the example 2. The MRRs obtained are compiled in the Table 8.

TABLE 8

The Silicon and Copper MRRs of the CMP Slurries 5 and C3

| CMP Slurry No. | Silicon MRR/Å/min | | | Copper MRR/Å/min | | |
|---|---|---|---|---|---|---|
| | Run 1 | Run 2 | Run 3 | Run 1 | Run 2 | Run 3 |
| 5 | 7930 | 7790 | 7930 | 9540 | 9750 | 9790 |
| C3 | 1370 | 1370 | 1370 | 15,270 | 15,450 | 15,380 |

The CMP slurries 5 and C3 with showed stable silicon and copper MRRs for all 3 runs. At a much lower pH than 10 (no potassium hydroxide added for pH adjustment), the silicon MRR was much lower than at pH 10.9 but the copper MRR was significantly increased.

Example 6

The Silicon and Copper MRRs of the CMP Slurries 6.1 to 6.3—Shelflife Performance The CMP slurries 6.1 to 6.3 were prepared by dissolving and dispersing their components in ultrapure water. The Table 9 shows the components and their amounts used.

TABLE 9

The Compositions of the CMP Slurries 6.1 to 6.3

| CMP Slurry No. | Silica/ % by weight | 1,2,3-Triazole/ % by weight | Potassium Persulfate/ % by weight | pH |
|---|---|---|---|---|
| 6.1 | 10 | 0.3 | 0.3 | 11.1-11.19 |
| 6.2 | 10 | 0.3 | 0.6 | 11.1-11.19 |
| 6.3 | 10 | 0.3 | 1 | 11.1-11.19 |

The freshly prepared precursors of the CMP slurries 6.1 to 6.3 (without the oxidizing agent KPS) were stored for 5 days. The pH of the CMP slurries was checked after 1, 4 and 5 days and was found to be stable. After a shelflife of 5 days, the oxidizing agent KPS was added and 200 mm silicon wafers and 200 mm copper wafers were polished with the CMP slurries under the conditions and with the equipment described in the Example 2. The MRRs obtained are compiled in the Table 10.

TABLE 10

The Silicon and Copper MRRs of the CMP Slurries 6.1 to 6.3 after Shelflife of 5 Days

| CMP Slurry No. | Silicon MRR/Å/min | | | Copper MRR/Å/min | | |
|---|---|---|---|---|---|---|
| | Run 1 | Run 2 | Run 3 | Run 1 | Run 2 | Run 3 |
| 6.1 | 5330 | 6010 | 7110[a] | 5800 | 6590 | 6910 |
| 6.2 | 7930 | 7930 | 8060 | 8720 | 8720 | 9010 |
| 6.3 | 8340 | 8340 | 8340 | 10,070 | 10,110 | 10,017 |

[a] upon repetition of Run 3 the same copper MRR was obtained

The MRR data of the Table 10 corroborate that the precursors of the CMP slurries 6.1 to 6.3 without KPS had a shelf life of at least 5 days. After the addition of KPS the CMP slurries 6.1 to 6.3 exhibited MRRs which remained stable during this time period.

Again, the precursor of the CMP and slurry 6.1 (without KPS) was freshly prepared and stored for 5 and 7 days. Thereafter, KPS was added and the silicon and copper MRRs of the CMP slurries 6.1 were determined under the same conditions with the same equipment as described before. After a shelf life of the precursor of 5 days, a silicon MRR of 8060 Å/min and a copper MRR of 9010 Å/min were obtained. After a shelf life of the precursor of 7 days, the same silicon MRR and essentially the same copper MRR (9039 Å/min) were obtained.

Again, the precursor of the CMP slurry 6.3 (without KPS) was freshly prepared and stored. After a shelflife of the precursor of 1, 5 and 7 days, KPS was added to the precursor, the silicon and copper MRRs of the CMP slurries 6.3 were determined under the same conditions using the same equipment. The MRRs obtained are compiled in the Table and 11.

TABLE 11

The Silicon and Copper MRRs of the CMP Slurry 6.3

CMP slurry 6.3

| | Shelflife of the precursor/Days | | | | | | | | |
|---|---|---|---|---|---|---|---|---|---|
| | 1 | | | 5 | | | 7 | | |
| | | | | Runs | | | | | |
| | 1 | 2 | 3 | 1 | 2 | 3 | 1 | 2 | 3 |
| Silicon MRR/Å/min | 7930 | 7790 | 7930 | 8340 | 8340 | 8340 | 8880 | 8750 | 8880 |
| Copper MRR/Å/min | 9540 | 9750 | 9790 | 10,070 | 10,110 | 10,070 | 10,450 | 9860 | 10,510 |

The data of the Table 11 make appar 5 ent that the silicon and copper MRRs increased only slightly with increasing shelf life of the precursor.

Example 7

The Silicon and Copper MRR of the CMP Slurries 7.1 to 7.3—Variation of the Silica Concentration The CMP slurries 7.1 to 7.3 were prepared by dissolving and dispersing their components in ultrapure water. The Table 12 shows the components and their amounts used.

TABLE 12

The Compositions of the CMP Slurries 7.1 to 7.3

| CMP Slurry No. | Silica/ % by weight | 1,2,3-Triazole/ % by weight | Potassium Persulfate/ % by weight | pH |
|---|---|---|---|---|
| 7.1 | 2 | 0.3 | 0.6 | 11-11.1 |
| 7.2 | 5 | 0.3 | 0.6 | 11-11.1 |
| 7.3 | 10 | 0.3 | 0.6 | 11-11.1 |

200 mm silicon wafers and 200 mm copper wafers were polished with the CMP slurries 7.1 to 7.3 under the conditions and with the equipment described in the Example 2. The MRRs obtained are compiled in the Table 13.

TABLE 13

The Silicon and Copper MRRs of the CMP Slurries 7.1 to 7.3

| CMP Slurry No. | Silicon MRR/Å/min | | | Copper MRR/Å/min | | |
|---|---|---|---|---|---|---|
| | Run 1 | Run 2 | Run 3 | Run 1 | Run 2 | Run 3 |
| 7.1 | 6290 | 6330 | 6830 | 9540 | 9580 | 9650 |
| 7.2 | 8200 | 8200 | 7790 | 8970 | 9505 | 9505 |
| 7.3 | 7930 | 7930 | 8060 | 8720 | 8720 | 9010 |

The data of the Table 13 make apparent that the copper MRR was independent from the silica concentration. However, the silica concentration was preferably 5% by weight or higher in order to obtain a high silicon MRR.

Comparative Experiments C4 to C7

The Silicon Dioxide and Copper MRRs of CMP Slurries Containing Silica and Hydrogen Peroxide The CMP slurries C4 to C7 were prepared by dispersing and dissolving silica and hydrogen peroxide in ultrapure water. The amounts used are compiled into Table 14.

TABLE 14

The Compositions of the CMP Slurries C4 to C7

| CMP Slurry No. | Silica/ % by weight | Hydrogen peroxide/ % by weight | pH |
|---|---|---|---|
| C4 | 25 | 0 | 11 |
| C5 | 25 | 0.5 | 11 |
| C6 | 25 | 1 | 11 |
| C7 | 25 | 1.5 | 11 |

200 mm TEOS wafers and 200 mm copper wafers were polished with the CMP slurries C4 to C7 under the following conditions:
Polishing apparatus: AMAT Mirra (rotary type);
platen speed: 107 rpm;
carrier speed: 102 rpm;
polishing pad: IC1010-k groove pad;
pad conditioning: in-situ;
conditioner: 3M A166;
conditioning downforce: 5 lbf (22.23 N);
4 dummy wafers before CMP
slurry flow rate: 200 ml/min;
polishing downforce: 3.5 psi (205 mbar);
polishing time: 60 seconds.
The TEOS and Copper MRRs are compiled into Table 15.

TABLE 15

The TEOS and Copper MRRs of the CMP Slurries C4 to C7

| CMP Slurry No. | TEOS MRR/Å/min | Copper MRR/Å/min |
|---|---|---|
| C4 | 3144 | <2500 |
| C5 | 3617 | 3186 |
| C6 | 3409 | 2336 |
| C7 | 3326 | 2248 |

The data of Table 15 make apparent that the silicon dioxide CMP slurry could be directly applied to TSV application just by adding hydrogen peroxide. However, although the WIWNU of the polished copper wafers was about 5%, the copper MRR was too low for practical purposes. Moreover, the water stability at high pH (>9) was still a challenge.

Example 8

The TEOS and Copper MRR of the CMP Slurries 8.1 to 8.3 and the Copper over Oxide Selectivity The CMP slurries 8.1 to 8.3 were prepared by dissolving and dispersing their components in ultrapure water. The components and their amounts are compiled in Table 16.

TABLE 16

The Compositions of the CMP Slurries 8.1 to 8.3

| CMP Slurry No. | Silica/ % by weight | 1,2,3-Triazole/ % by weight | pH |
|---|---|---|---|
| 8.1 | 25 | 0.1 | 11 |
| 8.2 | 25 | 0.4 | 11 |
| 8.3 | 25 | 0.8 | 11 |

The CMP slurries 8.1 to 8.3 were complemented by adding one part of a 2% by weight potassium persulfate solution of pH 13 to 2 parts by weight of each CMP slurry.

In the TEOS and copper MRRs were determined using the equipment and the methods described in the Comparative Experiments C4 to C7. The obtained MRRs are compiled in the Table 17.

TABLE 17

The TEOS and Copper MRRs and the WIWNU of the CMP Slurries 8.1 to 8.3 and Their Selectivity

| CMP Slurry No. | TEOS MRR/ Å/min | TEOS WIWNU/ % | Copper MRR/ Å/min | Copper WIWNU/ % | Copper over Oxide Selectivity |
|---|---|---|---|---|---|
| 8.1 | 3623 | 5.4 | 3824 | 17.6 | 1.06 |
| 8.2 | 3637 | 5.2 | >9000 | Over-polishing | >2.5 |
| 8.3 | 3776 | 5.0 | >9000 | Over-polishing | >2.4 |

The data of the Table 17 demonstrate that the addition of 1,2,3-triazole lead to a dramatic increase of the copper MRR. Therefore, 1,2,3-triazole acted as a chelating agent in the CMP slurries and could be most effectively used for tuning the CMP slurries.

Example 9

The TEOS and Copper MRR of the CMP Slurries 9.1 to 9.4 and the Oxide over Copper Selectivity The CMP slurries 9.1 to 9.4 were prepared by dissolving and dispersing their components in ultrapure water. The components and their amounts are compiled in Table 18.

TABLE 18

The Compositions of the CMP Slurries 9.1 to 9.4

| CMP Slurry No. | Silica/ % by weight | 1,2,3-Triazole/ % by weight | 1,2,4-Triazole/ % by weight | pH |
|---|---|---|---|---|
| 91 | 20 | 0.1 | 0 | 11 |
| 9.2 | 20 | 0.1 | 0.05 | 11 |
| 9.3 | 20 | 0.1 | 0.1 | 11 |
| 9.4 | 20 | 0.1 | 0.2 | 11 |

The CMP slurries 9.1 to 9.4 were complemented by adding one part of a 2% by weight potassium persulfate solution of pH 13 to 2 parts by weight of each CMP slurry.

The TEOS and copper MRRs were determined using the equipment and the methods described in the Comparative Experiments C4 to C7. The obtain MRRs are compiled in the Table 19.

TABLE 19

The TEOS and Copper MRRs and the WIWNU of the CMP Slurries 9.1 to 9.4 and Their Selectivities

| CMP Slurry No. | TEOS MRR/ Å/min | TEOS WIWNU/ % | Copper MRR/ Å/min | Copper WIWNU/ % | Copper over Oxide Selectivity |
|---|---|---|---|---|---|
| 9.1 | 3506 | 3.7 | 3863 | 19.6 | 1.1 |
| 9.2 | 3465 | 4.1 | 6180 | 9.8 | 1.78 |
| 9.3 | 3527 | 3.2 | 3340 | 2.7 | 0.95 |
| 9.4 | 3362 | 4.0 | 4347 | 2.4 | 1.29 |

The data of the Table 19 demonstrate again that the TEOS and copper MRRs and the copper over oxide selectivity could be effectively tuned with 1,2,3-triazole. The WIWNU of copper could be improved by adding 1,2,4-triazole.

Example 10

The Copper MRRs of the CMP Slurries 10.1 to 10.8 As a Function of the Silica Concentration The CMP slurries 10.1 to 10.8 were prepared by dissolving and dispersing their components in ultrapure water. The components and their amounts are compiled in the Table 20.

TABLE 20

The Compositions of the CMP Slurries 10.1 to 10.8

| CMP Slurry No. | Silica/ % by weight | 1,2,3-Triazole/ % by weight | Hydrogen peroxide/ % by weight | pH |
|---|---|---|---|---|
| 10.1 | 1 | 1 | 1 | 11 |
| 10.2 | 3 | 1 | 1 | 11 |
| 10.3 | 5 | 1 | 1 | 11 |
| 10.4 | 10 | 1 | 1 | 11 |
| 10.5[a] | 1 | 1 | — | 11 |
| 10.6[a] | 3 | 1 | — | 11 |
| 10.8[a] | 5 | 1 | — | 11 |
| 10.9[a] | 10 | 1 | — | 11 |

[a]The CMP slurries 10.5 to 10.9 were complemented by adding one part of a 2% by weight potassium persulfate solution of pH 13 to 2 parts by weight of each CMP slurry.

The copper MRRs were determined using the equipment and the methods described in the Comparative Experiments C4 to C7. The obtained MRRs are compiled in the Table 21.

TABLE 21

The Copper MRRs and the WIWNU of the CMP Slurries 10.1 to 10.8

| CMP Slurry No. | Copper MRR/Å/min | Copper WIWNU/% |
|---|---|---|
| 10.1 | 10,000 | 4 to 6 |
| 10.2 | 11,000 | " |
| 10.3 | 12,000 | " |
| 10.4 | 12,000 | " |
| 10.5 | 8900 | 4 to 16 |
| 10.6 | 9000 | " |
| 10.7 | 9100 | " |
| 10.8 | 9200 | " |

The data of the Table 21 corroborate that, in the presence of 1,2,3-triazole, a very high copper MRR was achieved already with 1% by weight of silica and that the copper MRR was virtually independent of the silica concentration.

We claim:

1. A method for manufacturing a through-base semiconductor wafer via, the method comprising:
   (i) affixing a frontside of a semiconductor wafer to a carrier, wherein the semiconductor wafer comprises an electrically conductive via comprising an electrically conductive metal and extending from the frontside of the semiconductor wafer at least partially through the semiconductor wafer;
   (ii) contacting a backside of the semiconductor wafer with a polishing pad and an aqueous chemical mechanical polishing composition having a pH of at least 9 and comprising
      (A) abrasive particles;
      (B) an oxidizing agent comprising a peroxide group; and
      (C) 1,2,3-triazole, acting both as a metal chelating agent and a metal corrosion inhibitor, wherein the aqueous chemical mechanical polishing composition does not comprise hydrogen peroxide; and
   (iii) chemically mechanically polishing the backside of the semiconductor wafer until at least one electrically conductive via is exposed, thereby obtaining the through-base semiconductor wafer via.

2. The method according to claim 1, wherein the semiconductor wafer is a silicon wafer.

3. The method according to claim 1, wherein the electrically conductive metal is selected from the group consisting of copper and tungsten.

4. The method according to claim 1, wherein the frontside of the semiconductor wafer carries integrated circuits.

5. The method according to claim 1, wherein the aqueous chemical mechanical polishing composition has a pH of at least 10.

6. The method according to claim 1, wherein the abrasive particles (A) are particles comprising silica, alumina, titania, zirconia, germania, ceria, a co-formed product thereof, or a mixture thereof.

7. The method according to claim 1, wherein the oxidizing agent (B) is selected from the group consisting of a monopersulfate and a dipersulfate.

8. The method according to claim 1, wherein the backside of the semiconductor wafer additionally comprises a silicon oxide dielectric film.

9. The method according to claim 1, wherein the backside of the semiconductor wafer is chemically mechanically polished at a silicon removal rate MRR of at least 5000 Å/min (500 nm/min) at a downforce of 4 psi (234.3 mbar) or less.

10. The method according to claim 1, wherein the backside of the semiconductor wafer is chemically mechanically polished at a copper removal rate MRR of at least 5000 Å/min (500 nm/min) at a downforce of 4 psi (234.3 mbar) or less.

11. The method according to claim 1, wherein the backside of the semiconductor wafer is chemically mechanically polished at a silicon oxide dielectric removal rate MRR of at least 3000 Å/min (300 nm/min) at a downforce of 4 psi (234.3 mbar) or less.

12. The method according to claim 1, wherein the abrasive particles (A) are organic or inorganic particles.

13. The method according to claim 1, wherein the 1,2,3-triazole is present in the aqueous chemical mechanical polishing composition in an amount of 0.05 to 5% by weight, based on a weight of the composition.

14. The method according to claim 1, wherein the backside of the semiconductor wafer is chemically mechanically polished at a silicon removal rate MRR of at least 5000 Å/min (500 nm/min) at a downforce of 4 psi (234.3 mbar) or less, and the backside of the semiconductor wafer is chemically mechanically polished at a copper removal rate MRR of at least 5000 Å/min (500 nm/min) at a downforce of 4 psi (234.3 mbar) or less.

15. The method according to claim 1, wherein the backside of the semiconductor wafer is chemically mechanically polished at a copper over silicon selectivity in a range of 0.90 to 1.64.

16. The method according to claim 1, wherein the backside of the semiconductor wafer is chemically mechanically polished at an oxide over copper selectivity of greater than 1.

17. The method according to claim 1, wherein the aqueous chemical mechanical polishing composition additionally comprises a functional component (D) which is different from components (A), (B) and (C).

18. The method according to claim 17, wherein the functional component (D) is selected from the group consisting of a material comprising a surfactant, a polyhydric alcohol comprising at least two hydroxy groups, a material having a lower critical solution temperature LCST, a material having an upper critical solution temperature UCST, an oxidizing agent, a passivating agent, a complexing or chelating agent, a fictive agent, a stabilizing agent, a metal corrosion inhibitor, a pH-adjusting agent, a buffering agent, a tantalum nitride enhancer, a rheology agent, a metal cation, a theorine-comprising compound, a charge reversal agent, and a water-miscible organic solvent.

19. The method according to claim 1, wherein:
   the electrically conductive metal comprises copper;
   the abrasive particles (A) are particles comprising silica; and
   the oxidizing agent (B) comprises potassium persulfate.

20. The method according to claim 19, wherein:
   the aqueous chemical mechanical polishing composition has a pH of at least 10, and comprises:
   the silica abrasive particles (A) in an amount of 0.005 to 30% by weight;
   the potassium persulfate oxidizing agent (B) in an amount of 0.3 to 2% by weight; and
   the 1,2,3-triazole (C) in an amount of 0.1 to 1% by weight;
   based on a weight of the aqueous chemical mechanical polishing composition.

* * * * *